(12) United States Patent
McPhalen

(10) Patent No.: US 11,758,308 B2
(45) Date of Patent: Sep. 12, 2023

(54) SYSTEMS AND METHODS FOR IMPROVING FREQUENCY RESPONSE OF A HIGH-SPEED DATA ACQUISITION DEVICE

(71) Applicant: Schneider Electric USA, Inc., Boston, MA (US)

(72) Inventor: Erin C. McPhalen, Victoria (CA)

(73) Assignee: Schneider Electric USA, Inc., Boston, MA (US)

( * ) Notice: Subject to any disclaimer, the term of this patent is extended or adjusted under 35 U.S.C. 154(b) by 135 days.

(21) Appl. No.: 16/662,921

(22) Filed: Oct. 24, 2019

(65) Prior Publication Data

US 2021/0112317 A1    Apr. 15, 2021

Related U.S. Application Data

(60) Provisional application No. 62/914,194, filed on Oct. 11, 2019.

(51) Int. Cl.
*G01R 27/32* (2006.01)
*H04Q 9/00* (2006.01)
(Continued)

(52) U.S. Cl.
CPC ........... *H04Q 9/00* (2013.01); *G01R 13/0272* (2013.01); *G01R 27/32* (2013.01); *H04B 1/0021* (2013.01);
(Continued)

(58) Field of Classification Search
CPC .. H04Q 9/00; H04Q 2209/60; H04Q 2209/30; H04B 1/0042; H04B 1/0021; G01R 13/0272; G01R 27/32; G08C 19/00
See application file for complete search history.

(56) References Cited

U.S. PATENT DOCUMENTS 5,485,152 A * 1/1996 Wilson ................... H03H 17/06
                                                                341/143
6,893,917 B2 * 5/2005 Hsieh ..................... H01L 27/115
                                                                438/257
(Continued)

FOREIGN PATENT DOCUMENTS

| CN | 100375473 C | * | 3/2008 | ............ H03M 1/185 |
| CN | 107077264 A | * | 8/2017 | ......... G06F 3/03545 |
| WO | WO-2012151594 A2 | * | 11/2012 | .............. H02M 3/07 |

OTHER PUBLICATIONS

Vukosavic et al, "AC Current Controller with Error-Free Feedback Acquisition System", pp. 381-392 (Year: 2016).*

*Primary Examiner* — Eyob Hagos
(74) *Attorney, Agent, or Firm* — Locke Lord LLP

(57) ABSTRACT

A method for improving frequency response of a high-speed data acquisition device includes sampling signals received at an input of the high-speed data acquisition device at a first sampling rate and generating a digital data stream representative of the sampled input signals. The digital data stream is interpolated to generate an interpolated digital signal with a higher sample rate than the first sampling rate, and one or more finite impulse response (FIR) filters are applied to the interpolated digital signal to generate a filtered digital signal. The filtered digital signal corrects for: parasitic and/or expected response of elements from the network of resistors and capacitors in the anti-aliasing filter in the high-speed data acquisition device, and select anti-aliasing filter response characteristics. The filtered digital signal is decimated to reduce the sampling rate of the filtered digital signal and generate a decimated digital signal.

27 Claims, 8 Drawing Sheets

(51) Int. Cl.
    *G01R 13/02*   (2006.01)
    *H04B 1/00*    (2006.01)
(52) U.S. Cl.
    CPC ....... *H04B 1/0042* (2013.01); *H04Q 2209/30* (2013.01); *H04Q 2209/60* (2013.01)

(56) References Cited

U.S. PATENT DOCUMENTS

| | | | |
|---|---|---|---|
| 10,033,403 B1* | 7/2018 | Thiagarajan | H03H 17/0294 |
| 10,491,237 B1* | 11/2019 | Kim | H03M 3/464 |
| 2006/0166637 A1* | 7/2006 | Lore | H03D 7/1441 |
| | | | 455/313 |
| 2006/0224365 A1* | 10/2006 | Pickerd | G01R 13/0272 |
| | | | 702/190 |
| 2007/0146181 A1* | 6/2007 | Chen | H03M 1/1004 |
| | | | 341/120 |
| 2008/0243406 A1* | 10/2008 | Pupalaikis | H03H 17/06 |
| | | | 702/66 |
| 2010/0289567 A1* | 11/2010 | Iida | H03H 15/00 |
| | | | 327/554 |
| 2010/0324845 A1* | 12/2010 | Spanier | G01R 22/10 |
| | | | 702/62 |
| 2015/0280660 A1* | 10/2015 | Azin | H03F 3/45183 |
| | | | 330/260 |
| 2015/0319768 A1* | 11/2015 | Abdelmonem | H04L 5/0021 |
| | | | 455/501 |
| 2018/0180652 A1* | 6/2018 | Sestok, IV | G01R 27/16 |
| 2019/0245337 A1* | 8/2019 | Oda | H04B 17/20 |
| 2020/0309828 A1* | 10/2020 | Ahn | H04L 67/12 |

* cited by examiner

SYSTEMS AND METHODS FOR IMPROVING FREQUENCY RESPONSE OF A HIGH-SPEED DATA ACQUISITION DEVICE

CROSS REFERENCE TO RELATED APPLICATION

This application claims the benefit of and priority to U.S. Provisional Application No. 62/914,194, filed on Oct. 11, 2019 under 35 U.S.C. § 119(e), which application is incorporated by reference herein in its entirety.

FIELD

This disclosure relates generally to high-speed data acquisition devices and, more particularly, to systems and methods for improving frequency response of a high-speed data acquisition device.

BACKGROUND

As is known, high-speed data acquisition devices are used in a variety of applications. One example application is power quality monitoring applications in which power quality meters monitor an electrical/power system for power quality issues. The power quality meters may include one or more high-speed data acquisition devices, for example, for capturing energy-related transients (e.g., voltage and/or current transients) and identifying power quality issues in the power system.

High-speed data acquisition devices typically include a plurality of electrical components, for example, analog, digital and/or mixed signal electrical components. As is known, variances (e.g., hardware variances) in these electrical components may impact accuracy of an output (or outputs) of the high-speed data acquisition devices and, thus, accuracy an output (or outputs) of systems and/or devices including the high-speed data acquisition devices. For example, an output (or outputs) of a power quality meter including the high-speed data acquisition devices may be impacted by these component variations, which may result in inaccurate identification of power quality issues by the power quality meter.

SUMMARY

Described herein are systems and methods related to improving frequency response of a high-speed data acquisition device. The high-speed data acquisition device (e.g., capable of capturing signals in the MHz range) may be utilized in an electrical/power system, for example. The power system may be associated with at least one load, process, building, facility, watercraft, aircraft, or other type of structure, for example.

In one aspect of this disclosure, a method for improving frequency response of a high-speed data acquisition device includes sampling signals (e.g., voltage and/or current signals) received at an input of the high-speed data acquisition device at a first sampling rate (e.g., 10 MHz or another suitable sample rate) using a measurement circuit of the high-speed data acquisition device. A digital data stream representative of the sampled input signals may be generated at an output of an analog-to-digital converter (ADC) (or another analog-to-digital conversion device) coupled to the measurement circuit, and the digital data stream may be interpolated to generate an interpolated digital signal with a higher sample rate than the first sampling rate. One or more finite impulse response (FIR) filters may be applied to the interpolated digital signal to generate a filtered digital signal. The filtered digital signal may, for example, correct for: parasitic and/or expected response of elements from a network of resistors and capacitors in an anti-aliasing filter provided in the measurement circuit, and select anti-aliasing filter response characteristics. The filtered digital signal may be decimated to reduce the sampling rate of the filtered digital signal and generate a decimated digital signal. The decimated digital signal corrects for gain errors in the sampled input signals, for example, and may be indicative of or used to identify energy-related transients (e.g., voltage and/or current transients). In some embodiments, the decimated digital signal is provided to one or more systems or devices (e.g., in the power system) for further processing. For example, in power quality monitoring applications, the decimated digital signal may be provided to one or more systems or devices (e.g., in or associated with a power quality meter) to identify power quality issues in a power system.

In accordance with some embodiments of this disclosure, an output of the measurement circuit is distorted from the sampled input signals due, at least in part, to the parasitic and/or the expected response of elements from the network of resistors and capacitors in the anti-aliasing filter, and the select anti-aliasing filter response characteristics. For example, the combination of the anti-aliasing filter and the parasitic may generate a waveform (or signal) that is distorted from the original waveform (or signal) (i.e., the sampled input signals). In accordance with some embodiments of this disclosure, the anti-aliasing filter response characteristics is selected such that the anti-aliasing filter has gain roll off before the Nyquist rate. In some embodiments, the change in gain is compensated for so that the frequency response of the filtered digital signal is accurate up to the Nyquist rate.

The anti-aliasing filter may be provided, for example, in an analog front end section of the measurement circuit. In some embodiments, the analog front end section includes at least one active electrical component (e.g., op-amps, etc.). Additionally, in some embodiments the analog front end section includes at least one passive electrical component (e.g., resistors, capacitors, inductors, etc.). In some embodiments, a filter coefficient for the one or more FIR filters is selected based on detected part variations (e.g., hardware variations) in the analog front end section. The part variations may be detected, for example, by a controller coupled to one or more components in the analog front end section. The controller may be configured to detect the part variations during a calibration step, the calibration step including determining correction required based on the detected part variations. In accordance with some embodiments of this disclosure, the filter coefficient may be adjusted from a first filter coefficient to a second filter coefficient different from the first filter coefficient in response to detected changes in the part variations. The first and second filter coefficients may be selected, for example, based on the particular application.

In accordance with some embodiments of this disclosure, the digital data stream may be interpolated using one or more cascaded integrated comb (CIC) filters, and interpolated digital signal may be filtered using one or more CIC filters. As is known, a CIC filter is one example implementation of a FIR filter. In one example implementation, the FIR filter may be a FIR interpolation filter. A FIR interpolation filter may be a desirable implementation in some embodiments since the gain response can be specified in the filter implementation.

In accordance with some embodiments of this disclosure, the filtered digital signal may be decimated using one or more CIC decimation filters. As is known, a CIC decimation filter is an efficient implementation of a moving average filter.

It is understood that CIC filters (and other FIR filters, etc.) may be implemented in hardware, software, or a combination of hardware and software, for example. CIC filters are well known in the art, and thus will not be described in detail herein.

In accordance with some embodiments of this disclosure, the high-speed data acquisition device input is coupled to a signal source, and the signals received at the high-speed data acquisition device input correspond to signals from the signal source. The signal source may correspond to or include a utility power source, for example.

In accordance with some embodiments of this disclosure, the above-discussed method is implemented using a processor of the high-speed data acquisition device. As used herein, the term "processor" is used to describe an electronic circuit that performs a function, an operation, or a sequence of operations. The function, operation, or sequence of operations can be hard coded into the electronic circuit or soft coded by way of instructions held in a memory device. A processor can perform the function, operation, or sequence of operations using digital values or using analog signals.

In some embodiments, the processor can be embodied, for example, in a specially programmed microprocessor, a digital signal processor (DSP), or an application specific integrated circuit (ASIC), which can be an analog ASIC or a digital ASIC. Additionally, in some embodiments the processor can be embodied in configurable hardware such as FPGAs or programmable logic arrays (PLAs). In some embodiments, the processor can also be embodied in a microprocessor with associated program memory. Furthermore, in some embodiments the processor can be embodied in a discrete electronic circuit, which can be an analog circuit, a digital circuit or a combination of an analog circuit and a digital circuit. The processor may be coupled to one or more memory devices, with the processor and the memory device(s) configured to implement the above-discussed method.

A high-speed data acquisition device is also provided herein. In one aspect of this disclosure, the high-speed data acquisition device includes a measurement circuit coupled to an input of the high-speed data acquisition device and configured to sample signals received at the high-speed data acquisition device input at a first sampling rate. The measurement circuit includes an anti-aliasing filter implemented using a network of resistors and capacitors. The high-speed data acquisition device also includes an ADC coupled to an output of the measurement circuit and configured to generate a digital data stream representative of the sampled input signals at an output thereof, and an interpolator responsive to the digital data stream to generate an interpolated digital signal with a higher sample rate than the first sampling rate.

The high-speed data acquisition device further includes a FIR filter responsive to the interpolated digital signal to generate a filtered digital signal. The filtered digital signal corrects for: parasitic and/or expected response of elements from the network of resistors and capacitors in the anti-aliasing filter, and select anti-aliasing filter response characteristics. The high-speed data acquisition device further also includes a decimator responsive to the filtered digital signal to reduce the sampling rate of the filtered digital signal and generate a decimated digital signal. The decimated digital signal corrects for gain errors in the sampled input signals. In some embodiments, the decimated digital signal is provided to one or more systems, devices and/or high-speed data acquisition components (e.g., in the high-speed data acquisition device) for further processing. For example, the decimated digital signal may be used in a field programmable gate array (FPGA) where the filtering may be done, a microprocessor, a digital signal processor, or a communication port off system processing.

In accordance with some embodiments of this disclosure, the interpolator includes or is implemented using one or more CIC filters. Additionally, in accordance with some embodiments of this disclosure, the decimator includes or is implemented using one or more CIC filters.

In accordance with some embodiments of this disclosure, the high-speed data acquisition device corresponds to a high-speed data acquisition device for use in a metering device. The metering device may be a metering device (e.g., a high speed transient data acquisition device) for use in a power system, for example.

In some embodiments, the metering device may correspond to an intelligent electronic device (IED). As used herein, an IED is a computational electronic device optimized to perform a particular function or set of functions. Examples of IEDs include smart utility meters, power quality meters, microprocessor relays, digital fault recorders, and other metering devices. IEDs may also be embedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data as electrical parameters representing operating characteristics (e.g., voltage, current, waveform distortion, power, etc.) of the electrical distribution system. These parameters and characteristics may be analyzed by a user to evaluate potential performance, reliability or power quality-related issues. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

Some example metering devices for which the invention may be found suitable are the PowerLogic ION9000T and PowerLogic CM4000T power quality meters by Schneider Electric, for example.

It is understood that the disclosed high-speed data acquisition device and method for improving frequency response of a high-speed data acquisition device may additionally or alternatively be used in other applications besides metering applications. In particular, the concepts and techniques disclosed herein may be found suitable for use in substantially any application where it is desired to improve frequency response of a high-speed data acquisition device, as will become further apparent from discussions below.

This invention provides, among other features, signal conditioning techniques to provide waveform correction in a high-speed data acquisition device, and a component variation correction method for use in a high-speed data acquisition device. In accordance with embodiments of this disclosure, an audio signal shelving filter may be used in the high-speed data acquisition device to provide frequency domain waveform correction due to parasitic and compensation elements associated with them. Additionally, in accordance with embodiments of this disclosure an arbitrary magnitude FIR filter may be used to correct for anti-aliasing filter response in the band of interest.

In accordance with some embodiments of this disclosure, the invention may be found particularly suitable in applications where frequency accuracy/response of a high-speed data acquisition device is important. For example, it has been found that this invention may provide for a substantially increased frequency accuracy over implementations well-known in the art. For example, the invention may increase frequency accuracy from plus/minus twenty percent to less than plus/minus five percent in some implementations.

The typical anti-aliasing filter requires attenuation in the pass band in order to provide the required attenuation in the stop band before the Nyquist rate. This attenuation is readily characterized based on the order of the anti-aliasing filter implemented. In accordance with embodiments of this disclosure, by implementing a FIR filter with a gain curve opposite (or substantially opposite) to the attenuation introduced by the anti-aliasing filter in the pass band, the original signal can be compensated for over frequency due to the effects of the anti-aliasing filter. In one embodiment, for example, the anti-aliasing filter may have a particular roll-off (e.g., 3 dB at corner frequency) and the FIR filter may reduce the roll-off (e.g., from 3 dB to a value less than 3 dB, preferably as close to 0 dB as possible). In another embodiment, the compensation filter could correct for parasitics and component deviation introduced by the anti-aliasing filter or other front end components.

It is understood that there are many other advantages associated with the disclosed systems and methods, as will be appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
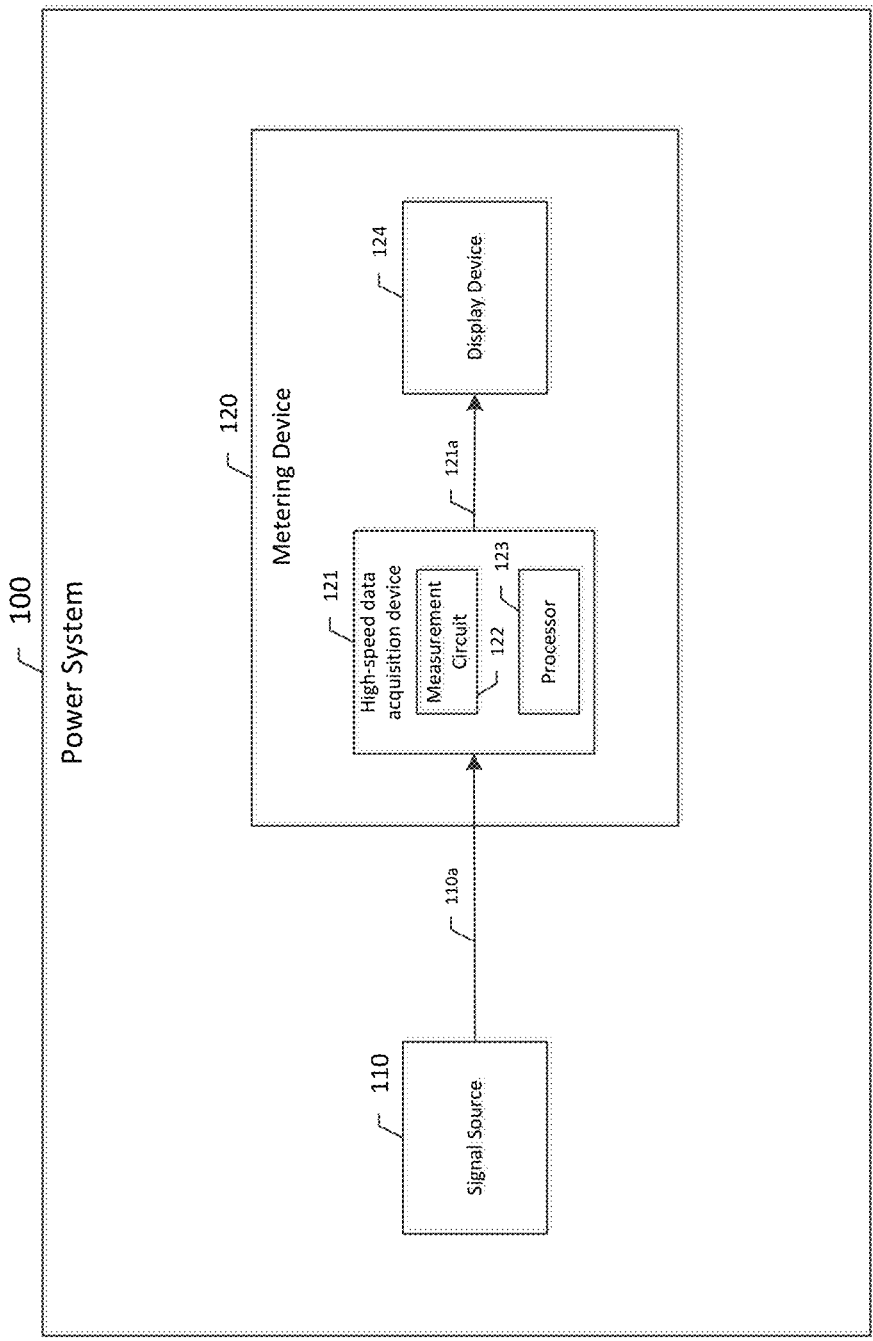
FIG. 1 is a block diagram of an example power system including a signal source and a metering device, the metering device including a high-speed data acquisition device.

Referring to FIG. 1, an example power system 100 in accordance with embodiments of this disclosure includes a signal source 110 and a metering device 120 capable of monitoring one or more parameters of the signal source 110. The signal source 110 and the metering device 120 may each take a variety of forms. For example, the signal source 110 may take the form of a renewable energy source (e.g., hydropower, geothermal, wind, and solar) or a non-renewable energy source (e.g., fossil fuel power plant). Additionally, the metering device 120 may take the form of a device for monitoring the amount of electric energy consumed by a residence or business, or a particular electrically powered device of the residence or business. The metering device 120 may be coupled to the signal source 110 by one or more connectors and/or mediums (e.g., transmission lines).

In some embodiments, the signal source 110 may be provided as, include, or be coupled to one or more loads in the power system 100. The loads may include, for example, machinery or apparatuses associated with a particular application (e.g., an industrial application), applications, and/or process(es). The machinery may include electrical or electronic equipment, for example. The machinery may also include the controls and/or ancillary equipment associated with the electrical or electronic equipment.

In the example embodiment shown, the metering device 120 includes a high-speed data acquisition device 121 and a display device 124. The high-speed data acquisition device 121 is coupled to receive a signal (or signals) 110a generated by the signal source 110 at an input and configured to generate a signal (or signals) 121a indicative of one or more monitored parameters of the signal 110a at an output thereof. For example, the high-speed data acquisition device 121 may be configured to capture energy-related transients (e.g., voltage and/or current transients) from the signal(s) 110a, for example, using a measurement circuit 122. The measurement circuit 122 may be coupled to a processor 123 of or associated with the high-speed data acquisition device 121, and include one or more sensor devices, for example, for capturing the energy-related transients (and performing other types of energy-related measurements, such as capturing voltage and/or current signals and performing temperature measurements). In some embodiments, the signal(s) 121a generated at the output of the high-speed data acquisition device 121 is indicative of the captured energy-related transients. Additionally, in some embodiments the output signal 121a is indicative of power quality issues identified from the captured energy-related transients. The power quality issues may, for example, correspond to power quality issues (e.g., voltage sags, voltage swells, and voltage transients) in the power system 100. It is understood there are types of power quality issues and there are certain characteristics of these types of power quality issues/events, for example, as defined in IEEE Standard 1159-2019

(known art). In accordance with embodiments of the disclosure, the output signal 121a may be correlated or compared with defined characteristics (e.g., standard or user defined characteristics, such as duration and magnitude) of power quality issues/events to detect the power quality issues.

In some embodiments, the output signal 121a may be provided to a display device for displaying the monitored parameters (or select ones of the monitored parameters), or information associated with the monitored parameters (such as power quality issues). The display device may be the display device 124 of the metering device 120, as shown. Additionally, or alternatively, the display device may be a display device of a remote computing device, for example.

In some embodiments, the output signal 121a may also be provided to control circuitry (not shown) for configuring (or controlling or adjusting) one or more of the monitored parameters (or loads in the power system 100), and/or taking one or more actions in response to the output signal 121a. For example, in embodiments in which the output signal 121a is indicative of power quality issues identified from captured energy-related transients, the output signal 121a may be used by the metering device 120 and/or control circuitry to identify event mitigation opportunities or reduce (or ideally eliminate) an impact of a power quality issue/event and install a mitigation device and/or perform mitigative actions, for example, as described in U.S. patent application Ser. No. 16/137,603, entitled "Dynamic Tolerance Curves For Power Monitoring Systems", which is assigned to the same assignee as the present disclosure. It is understood that other actions (e.g., generation of alarms, such as transient alarms, etc.) may be additionally or alternatively be taken. The control circuitry may be control circuitry of the metering device 120 and/or control circuitry coupled to the metering device 120.

In order to measure high voltage and high frequency transients (i.e., energy-related transients) accurately, for example, using the measurement circuit 122, a resistor (R)/capacitor (C) network is usually required to attenuate (sometimes equally) the high frequency and low pass frequency components of the input signal 110a while mitigating parasitic elements of the measurement circuit 122. As is known, a parasitic element is a circuit element (resistance, inductance or capacitance) or property that is present within/possessed by an electrical component, and typically has a negative effect on the performance of the circuit, for example, impacting the expected response of the circuit/element(s). For instance, a resistor is designed to possess resistance, but may also possess unwanted parasitic capacitance. In addition, an anti-aliasing filter that may be found in the analog section of the measurement circuit 122 may cause attenuation to the signal with in the passband.

The combination of the anti-aliasing filter and the parasitic generate a waveform that is distorted from the original analog waveform. The challenge with using an RC impedance network is that any imbalance due to component variation in either the C or R ratio of the network will lead to either an attenuation or gain that varies over frequency.

The foregoing may impact accuracy of the measurement circuit 122, the high-speed data acquisition device 121 and/or the metering device 120 if unaccounted for. For example, deviations in accuracy of measurements performed by the measurement circuit 122 may impact the accuracy of the measurement circuit output and, thus, the accuracy of the high-speed data acquisition device output. The foregoing may result in inaccurate measurement reporting by the metering device 120, which may lead to inaccurate detection and characterization of energy-related transients and power quality issues in the power system 100, for example. Accordingly, it is important to have systems and methods for improving the frequency response of the high-speed data acquisition device 121.

Example systems and methods for improving the frequency response of a high-speed data acquisition device (e.g., 121) are discussed in connection with figures below. It is understood that power system 100 is but one of many potential configurations of power systems in accordance with embodiments of this disclosure. For example, while the power system 100 is shown as including a single signal source 110 and a single metering device 120 in the illustrated embodiment, it is understood that the power system 100 may include a plurality of signal sources and/or a plurality of metering devices in some embodiments. In embodiments in which the signal source(s) is/are provided as, includes, or is/are coupled to one or more loads in the power system 100, the metering device(s) may be coupled to a respective one or more of the loads. In addition to capturing energy-related transients, the metering device(s) may be configured to monitor, analyze and/or control one or more parameters (e.g., energy-related parameters) associated with the loads, for example. It is understood that other configurations of power systems are possible.

Figure 2:
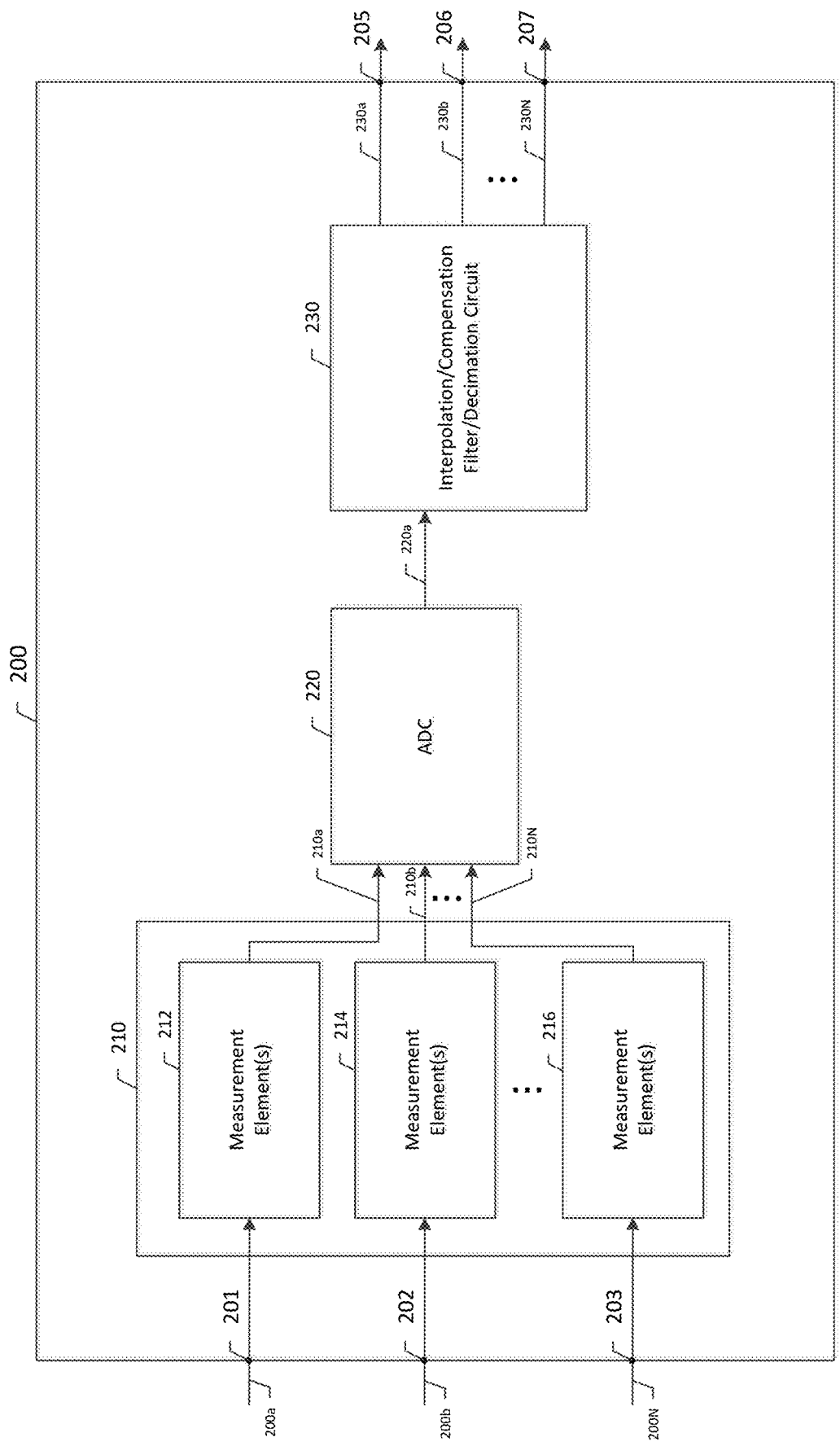
FIG. 2 is a block diagram of an example circuit in accordance with embodiments of the disclosure, the circuit including circuitry to improve frequency response of a high-speed data acquisition device.

Referring to FIG. 2, an example circuit 200 in accordance with embodiments of this disclosure is shown. In some embodiments, the circuit 200 illustrates an example configuration of a high-speed data acquisition device in accordance with embodiments of this disclosure. The circuit 200, which may be provided in a metering device (e.g., 120, shown in FIG. 1), for example, includes a measurement circuit 210, an analog-to-digital converter (ADC) 220 and an interpolation/compensation filter/decimation circuit 230 in the illustrated embodiment.

Figure 2A:
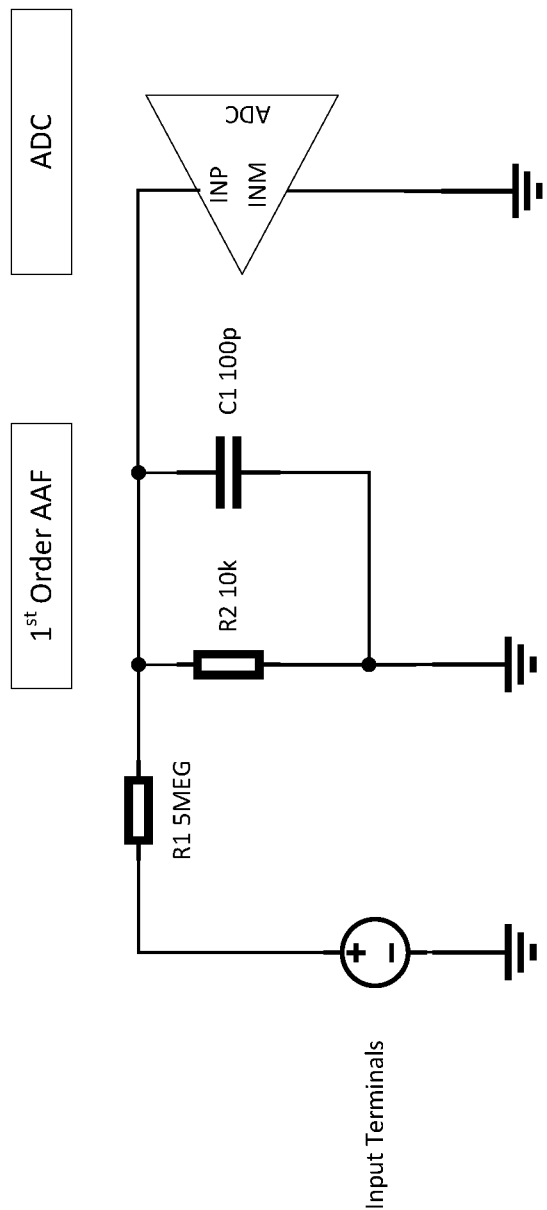
FIG. 2A shows an example implementation of an anti-aliasing filter.

In the example embodiments shown, the measurement circuit 210 includes a plurality of measurement elements (here, measurement elements 212, 214, 216), for example, for measuring or capturing energy-related transients (e.g., voltage and/or current transients). Each of the measurement elements 212, 214, 216 has a terminal (e.g., a first terminal) coupled to a respective input of the circuit 200 (here, inputs 201, 202, 203) in the example embodiment shown. In some embodiments, at least one of the measurement elements 212, 214, 216 includes a plurality of measurement elements. In accordance with some embodiments of this disclosure, the measurement elements 212, 214, 216 include one or more resistors (e.g., measurement resistors) and/or capacitors. Additionally, in accordance with some embodiments of this disclosure the measurement circuit 210 includes an anti-aliasing filter implemented using a network of resistors and capacitors (with these resistors and capacitors possessing undesirable parasitic elements). The anti-aliasing filter may be provided in an analog front end section of the measurement circuit (e.g., using the measurement elements 212, 214, 216), for example. An example anti-aliasing filter is shown in FIG. 2A, for example.

Figure 3:
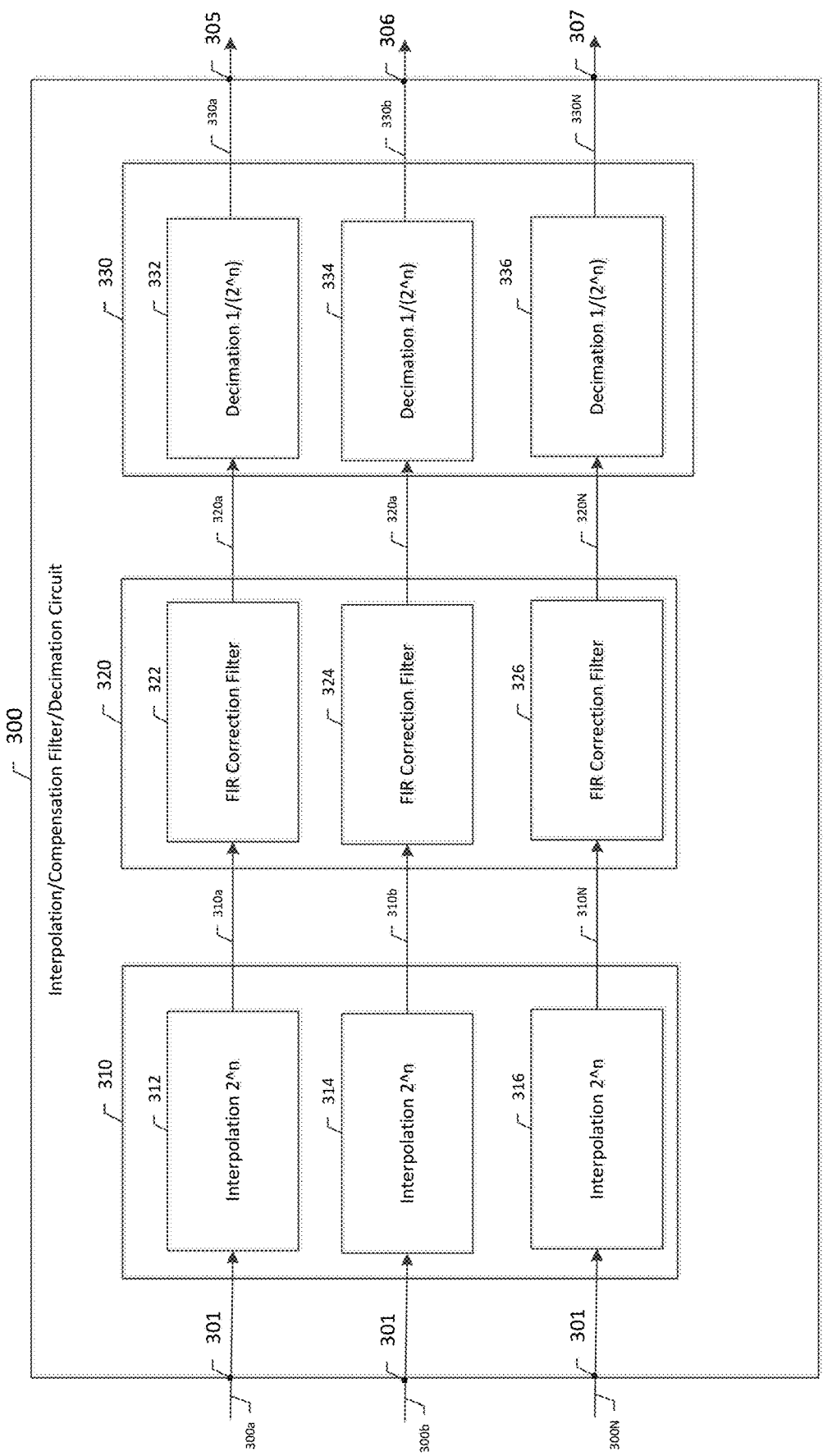
FIG. 3 is a block diagram of an example interpolation/compensation filter/decimation circuit in accordance with embodiments of the disclosure.

Returning to FIG. 2, the ADC 200 has at least one input (here, a like plurality of inputs as the plurality of measurement elements 212, 214, 216) and at least one output (here, a single output). The ADC inputs are coupled to respective terminals (e.g., second terminals) of the first measurement elements 212, 214, 216 and the ADC output is coupled to at least one input (here, a single input) of the interpolation/compensation filter/decimation circuit 230. The interpolation/compensation filter/decimation circuit 230 has at least one output (here, a like plurality of outputs as the plurality of measurement elements 212, 214, 216). In accordance with embodiments of this disclosure, the interpolation/compensation filter/decimation circuit 230 includes an interpolator, a finite impulse response (FIR) correction filter, and a decimator. One example implementation of the interpolation/compensation filter/decimation circuit 230 is shown in FIG. 3, for example.

During operation of circuit 200, the measurement circuit 210 is configured to sample signals 200a, 200b, 200N (e.g., energy-related signals) received at the high-speed data acquisition device inputs 201, 202, 203 and configured to provide respective output signals 210a, 210b, 210N (e.g., analog signals) indicative of the input signals 200a, 200b, 200N. In accordance with embodiments of the disclosure, the input signals 200a, 200b, 200N are sampled at a first sampling rate. The first sampling rate may, for example, be a user-configured sampling rate (e.g., based on the design application). In accordance with some embodiments of this disclosure, the output of the measurement circuit (here, output signals 210a, 210b, 210N) is distorted from the sampled input signals due, at least in part, to the parasitic and/or the expected response of elements from the network of resistors and capacitors in the anti-aliasing filter, and the select anti-aliasing filter response characteristics.

The ADC 220 is responsive to the measurement circuit output signals 210a, 210b, 210N to generate a digital data stream 220a representative of the measurement circuit output signals 210a, 210b, 210N (and the sampled input signals 200a, 200b, 200N) at an output thereof.

The interpolation/compensation filter/decimation circuit 230 is responsive to the digital data stream 220a to generate an interpolated digital signal with a higher sample rate than the first sampling rate by which the input signals 200a, 200b, 200N were originally sampled by the measurement circuit 210. Additionally, the interpolation/compensation filter/ decimation circuit 230 is responsive to the interpolated digital signal to generate a filtered digital signal. The filtered digital signal corrects for: parasitic and/or expected response of elements from the network of resistors and capacitors in the anti-aliasing filter, and select anti-aliasing filter response characteristics (e.g., by applying a correction filter that has a response that is opposite, or substantially opposite, to the anti-aliasing filter or other circuit effects). The interpolation/ compensation filter/decimation circuit 230 is further responsive to the filtered digital signal to reduce the sampling rate of the filtered digital signal and generate a decimated digital signal (here, signals 230a, 230b, 230N). In the example embodiment shown, the decimated digital signals 230a, 230b, 230N are provided at an output of the interpolation/ compensation filter/decimation circuit 230, and received at outputs 205, 206, 207 of the circuit 200. In accordance with embodiments of this disclosure, the decimated digital signals 230a, 230b, 230N may be provided to one or more systems or devices (e.g., in the power system) for further processing. For example, in power quality monitoring applications, the decimated digital signal may be provided to one or more systems or devices (e.g., in or associated with a power quality meter) to and identify power quality issues in a power system in which the circuit 200 is provided.

As illustrated above, incoming signal(s) (here, signals 200a, 200b, 200N) can be interpolated to a higher sample rate, then a combination of one or more FIR filters can be used to correct for the RC parasitic and anti-aliasing filter response in the waveform. Finally, decimation can be used to return the signal to a convenient sample rate. In addition, the FIR filter could be optimized by running one or more calibration signal into the analog front end, then have the intelligent controller determine and provide accurate filter coefficients based on part variations. Furthermore, the process of decimation and interpolation can be done using a CIC filter. The foregoing provides a highly efficient method of interpolation and decimation.

It is understood that circuit 200 is but one of many potential configurations of circuits associated with high-speed data acquisition devices in accordance with embodiments of this disclosure. For example, while the measurement circuit 210 is shown as including a plurality of measurement elements 212, 214, 216 arranged in a particular manner, it is understood that different arrangements of the measurement circuit 210 are possible. As noted above, one example implementation of interpolation/compensation filter/decimation circuit 230 of circuit 200 is shown in FIG. 3, for example.

Referring to FIG. 3, an example interpolation/compensation filter/decimation circuit 300 in accordance with embodiments of this disclosure an interpolator 310, a FIR filter 320 and a decimator 330. In the example embodiment shown, the interpolator 310 includes a plurality of interpolators 312, 314, 316, with each interpolator coupled to a respective input 301, 302, 303 of the interpolation/compensation filter/ decimation circuit 300. Additionally, in the example embodiment shown the FIR filter 320 (i.e., a FIR correction filter) includes a plurality of FIR filters 322, 324, 326, with each filter coupled to a respective output of the interpolator 310 from which interpolated signals 310, 310b, 310N are received. Further, in the example embodiment shown the decimator 330 includes a plurality of decimators 332, 334, 335, with each decimator coupled to a respective output of the filter 320 from which filtered signals 320a, 320b, 320N are received. The decimator 330 is coupled to outputs 305, 306, 307 of the interpolation/compensation filter/decimation circuit 300 at which decimated signals 330a, 330b, 330N are provided.

In accordance with some embodiments of this disclosure, a filter coefficient is selected for one or more of the FIR filters 322, 324, 326 based on detected part variations, for example, in the analog front end section of a measurement circuit in a high-speed data acquisition device which may include the interpolation/compensation filter/decimation circuit 300. The part variations (e.g., due to age, temperature, stress, parasitics, etc.) may be detected, for example, by a controller coupled to one or more components in the analog front-end section. The controller may, for example, be configured to detect the part variations during a calibration step. The calibration step may include determining correction required based on the detected part variations. The filter coefficient(s) of the FIR filters 322, 324, 326 may be adjusted, for example, from a first filter coefficient to a second filter coefficient different from the first filter coefficient in response to detected changes in the part variations. FIR filter coefficients are well known in the art, and thus are not discussed in detail herein.

Figure 4:
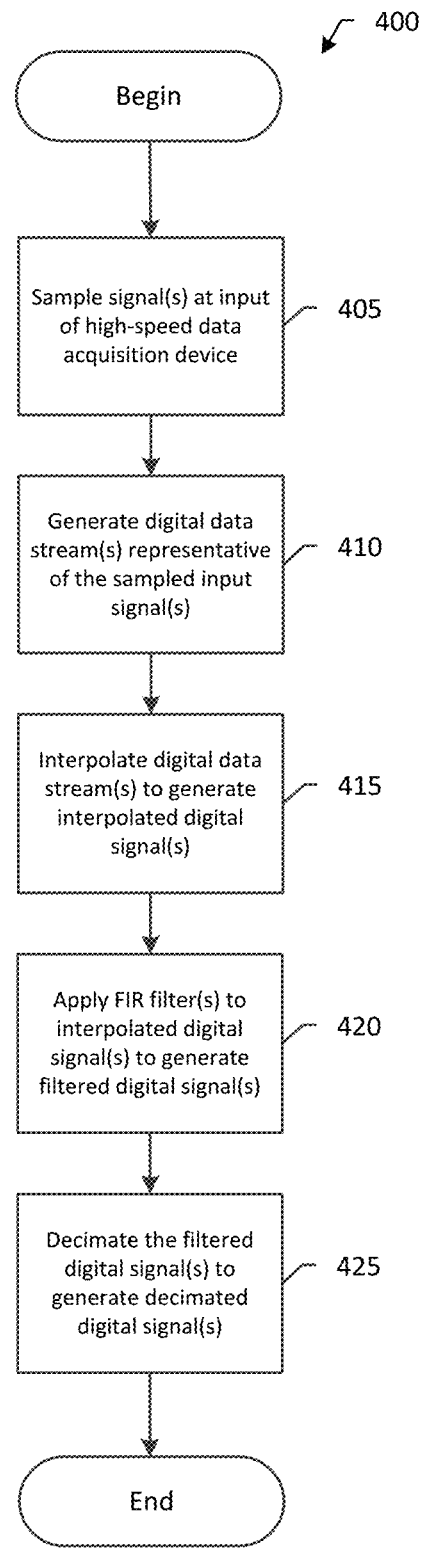
FIG. 4 is a flowchart illustrating an example method for improving frequency response of a high-speed data acquisition device in accordance with embodiments of the disclosure.

Referring to FIG. 4, a flowchart (or flow diagram) is shown to illustrate an example methods (here, method 400) of the disclosure for improving frequency response of a high-speed data acquisition device (e.g., 121, shown in FIG. 1). Rectangular elements (typified by element 405 in FIG. 4), as may be referred to herein as "processing blocks," may represent computer software and/or algorithm instructions or groups of instructions. Diamond shaped elements, as may be referred to herein as "decision blocks," represent computer software and/or algorithm instructions, or groups of instructions, which affect the execution of the computer software and/or algorithm instructions represented by the processing blocks. The processing blocks and decision blocks (and other blocks shown) can represent steps performed by functionally equivalent circuits such as a digital signal processor circuit or an application specific integrated circuit (ASIC).

The flowchart does not depict the syntax of any particular programming language. Rather, the flowchart illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowchart described below may be combined in some embodiments. Thus, unless otherwise stated, some features from the flowchart described below may be combined with other features of the flowchart described below, for example, to capture the various advantages and aspects of systems and methods associated with improving the frequency response of a high-speed data acquisition device sought to be protected by this disclosure. It is also understood that various features from the flowchart described below may be separated in some embodiments. For example, while the flowchart is shown having many blocks, in some embodiments the illustrated method shown by these flowcharts may include fewer blocks or steps.

Referring to FIG. 4, a flowchart illustrates an example method 400 for improving frequency response of a high-speed data acquisition device (e.g., 121, shown in FIG. 1). Method 400 may be implemented, for example, on a processor of or associated with the high-speed data acquisition device, for example, on a processor of a metering device (e.g., 123, shown in FIG. 1).

As illustrated in FIG. 4, the method 400 begins at block 405, where a signal (or signals) are captured by the high-speed data acquisition device, for example, using a measurement circuit (e.g., 122, shown in FIG. 1) of the high-speed data acquisition device. The signal(s) may include, for example, energy-related signals. The energy-related signals may include, for example, at least one of: a voltage signal, a current signal, and a derived energy-related value. In some embodiments, the derived energy-related value includes at least one of: a calculated, derived, developed, interpolated, extrapolated, evaluated, and otherwise determined additional energy-related value from the at least one of the voltage signal and the current signal. The energy-related signals may be indicative of energy-related transients (e.g., voltage and/or current transients), for example. The transients may have an associated duration and magnitude. As one example, the transients may correspond to sub-microsecond voltage transients having a peak voltage of up to a peak voltage of 10,000 volts. It is understood that this is but one of many potential transients that may be detected and captured by the high-speed data acquisition device.

In embodiments in which the high-speed data acquisition device is provided in a metering device, for example, the signal(s) captured at block 405 (e.g., energy-related signals) may be associated a particular metering point or points in a power system and/or be associated with a particular signal source and/or load(s) in the power system. The metering device may be installed or located, for example, at a respective metering point of a plurality of metering points in the power system, and coupled to one or more signals sources and/or loads in the power system.

In accordance with embodiments of this disclosure, the signal(s) captured at block 405 are sampled at first sampling rate. The first sampling rate may be a user-configured sampling rate in some embodiments. In some embodiments, the first (i.e., original) sampling rate is the functional sampling rate of an ADC used for generating a digital data stream (or digital data streams) at block 410. This is specified by design and/or specific implementation of an ADC circuit.

At block 410, a digital data stream (or digital data streams) representative of the signals captured at block 405 is generated, for example, at an output of an ADC (e.g., 220, shown in FIG. 2) or another suitable device. In accordance with embodiments of this disclosure, the signal(s) from which the digital data stream(s) is/are generated are distorted from the sampled input signal(s) (i.e., the signal(s) sampled at block 405), for example, due, at least in part, to the parasitic and/or the expected response of elements from a network of resistors and capacitors in an anti-aliasing filter provided in a measurement circuit used to sample the input signal(s). Additionally, the signal(s) from which the digital data stream is generated may be distorted from the sampled input signal(s) in response to select anti-aliasing filter characteristics (e.g., such that the anti-aliasing filter has gain roll off before the Nyquist rate), or parasitic elements associated with the input topology. In some embodiments, the parasitic capacitance of the input filter (i.e., the anti-aliasing filter) creates significant gain at high frequencies. High-speed data acquisition devices in accordance with embodiments of this disclosure may include a capacitor to compensate for this. Additionally, high-speed data acquisition devices in accordance with embodiments of this disclosure may compensate for non-uniform gain(s) produced in the circuit in response to variations in the parasitic capacitance of resistor(s) in the anti-aliasing filter and the compensation capacitor.

At block 415, the digital data stream(s) generated at block 410 is interpolated, for example, using an interpolation means (e.g., interpolator 310, shown in FIG. 3) to generate an interpolated digital signal (or interpolated digital signals) with a higher sampling rate (i.e., a second sampling rate) than the first sampling rate. In accordance with some embodiments, the higher sampling rate is an integer multiple of the first sampling rate, for example, two times the first sampling rate. In accordance with some embodiments, the interpolation is done to move the Nyquist rate of the original data rate to a lower frequency to relax the FIR filter requirements.

At block 420, one or more FIR filters are applied to the interpolated digital signal generated at block 415 to generate a filtered digital signal (or filtered digital signals). In accordance with embodiments of this disclosure, the filtered digital signal(s) correct for parasitic and/or expected response of elements from a network of resistors and capacitors in an anti-aliasing filter provided in a measurement circuit used to sample the input signals at block 405. Additionally, in accordance with embodiments of this disclosure, the filtered digital signal(s) corrects for select anti-aliasing filter response characteristics.

At block 425, the filtered digital signal(s) is/are decimated, for example, using a decimation means (e.g., decimator 330, shown in FIG. 3) to reduce the sampling rate of the filtered digital signal(s) and generate a decimated digital signal (or decimated digital signals). In accordance with embodiments of this disclosure, the decimated digital signal(s) correct for gain errors in the sampled input signal.

It is understood that method 400 may include one or more additional blocks in some embodiments. For example, in some embodiments the method may further include providing the decimated digital signal to one or more circuits, systems and/or devices for further processing. The circuits, systems and/or devices may be associated with, or provided in, the high-speed speed data acquisition device, for example. In embodiments in which the high-speed data acquisition device is provided in a metering device, for example, the decimated digital signal may be received by circuits, systems and/or devices in or associated with the metering device. In one embodiment, the decimated signal may be processed (e.g., on one or more processors in or associated with the metering device), for example, to identify power quality issues (e.g., voltage sags, swells, etc.) in a power system in which the metering device is provided/used. The processing may occur locally (e.g., at location proximate to the power system) or remotely (e.g., in the cloud).

In some embodiments, the decimated signal and/or signals representative of the decimated signal, may also be provided to a control system. The control system may be responsive to the decimated signal and/or signals representative of the decimated signal, for example, to control one or more aspects of a circuit, system (e.g., power system) or device including the high-speed data acquisition device. For example, in one embodiment the decimated signal and/or signals representative of the decimated signal may be indicative of a power quality issue in a power system, and the control system may be responsive to the signal(s) to adjust one or more parameters (e.g., associated with equipment/loads) in the power system to reduce the effects of the power quality issue.

Figure 5:
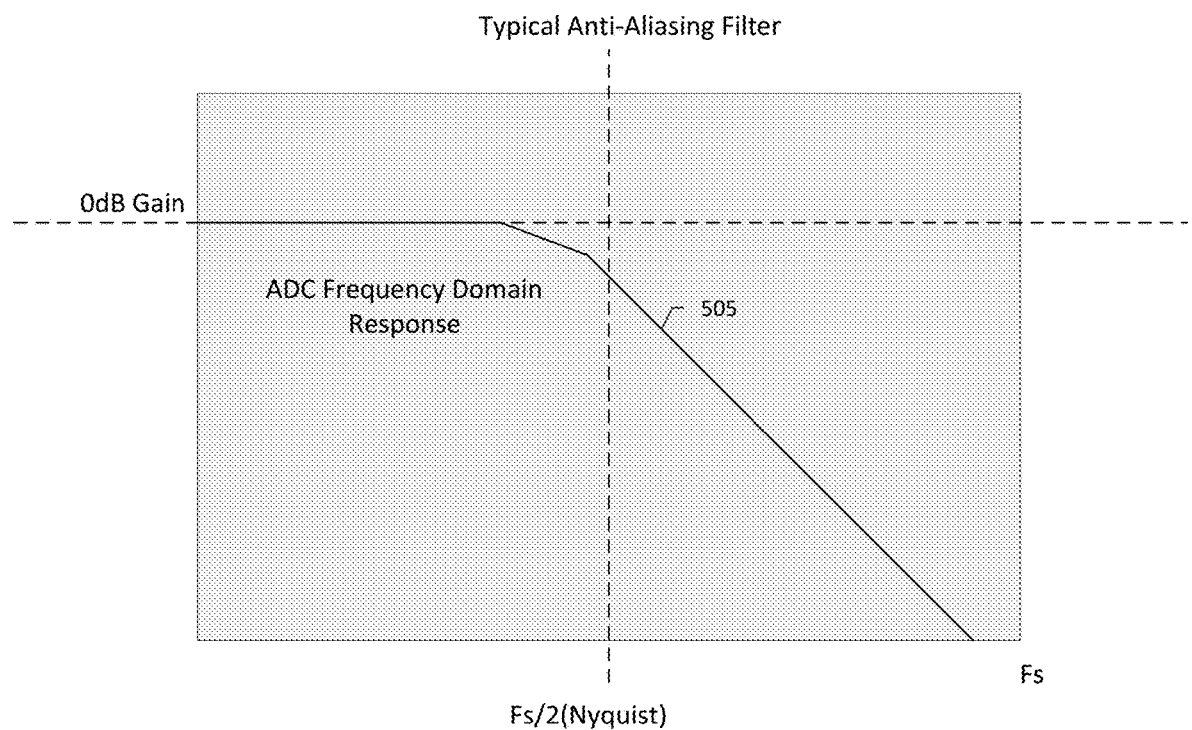
FIGS. 5-5D illustrate various concepts in accordance with embodiment of this disclosure.
Figure 5A:
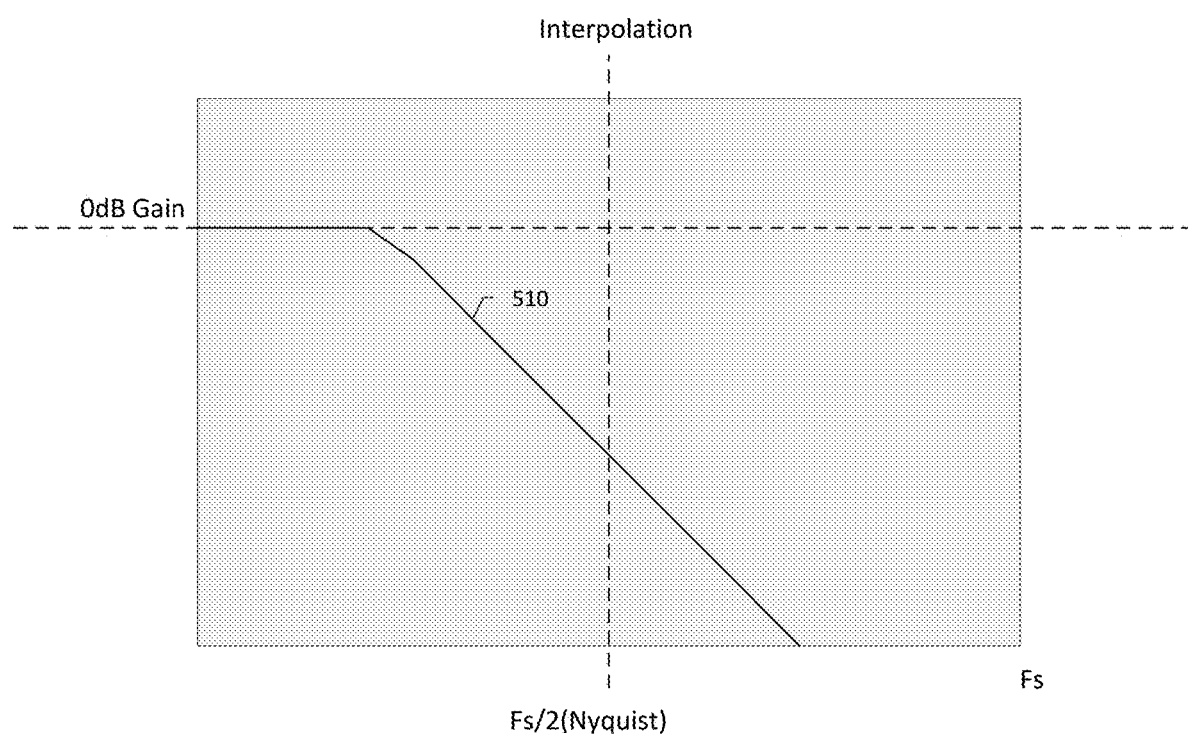
Figure 5B:
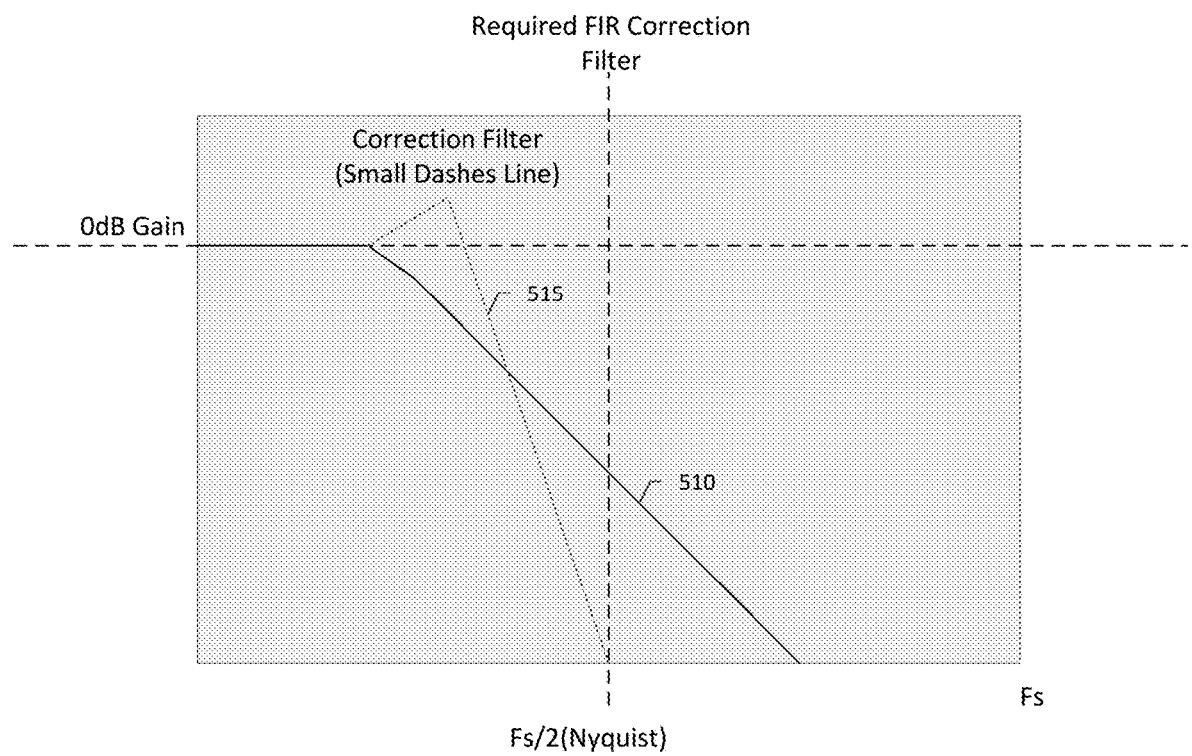
Figure 5C:
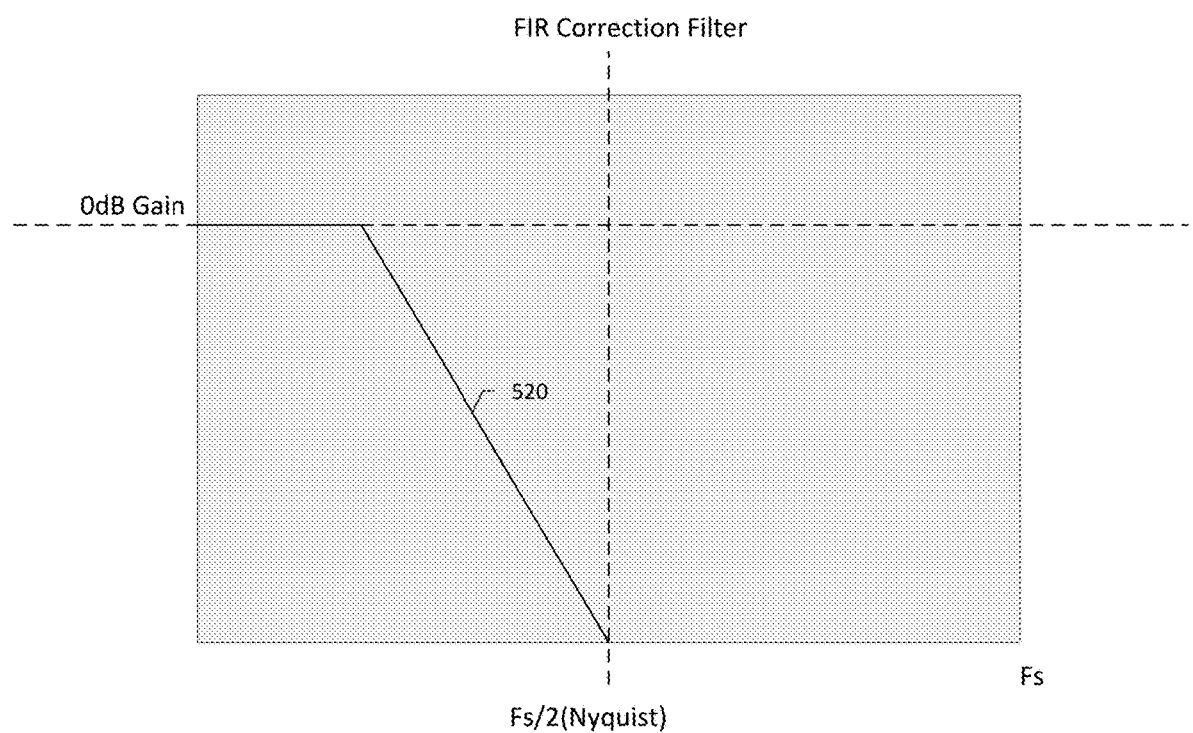
Figure 5D:
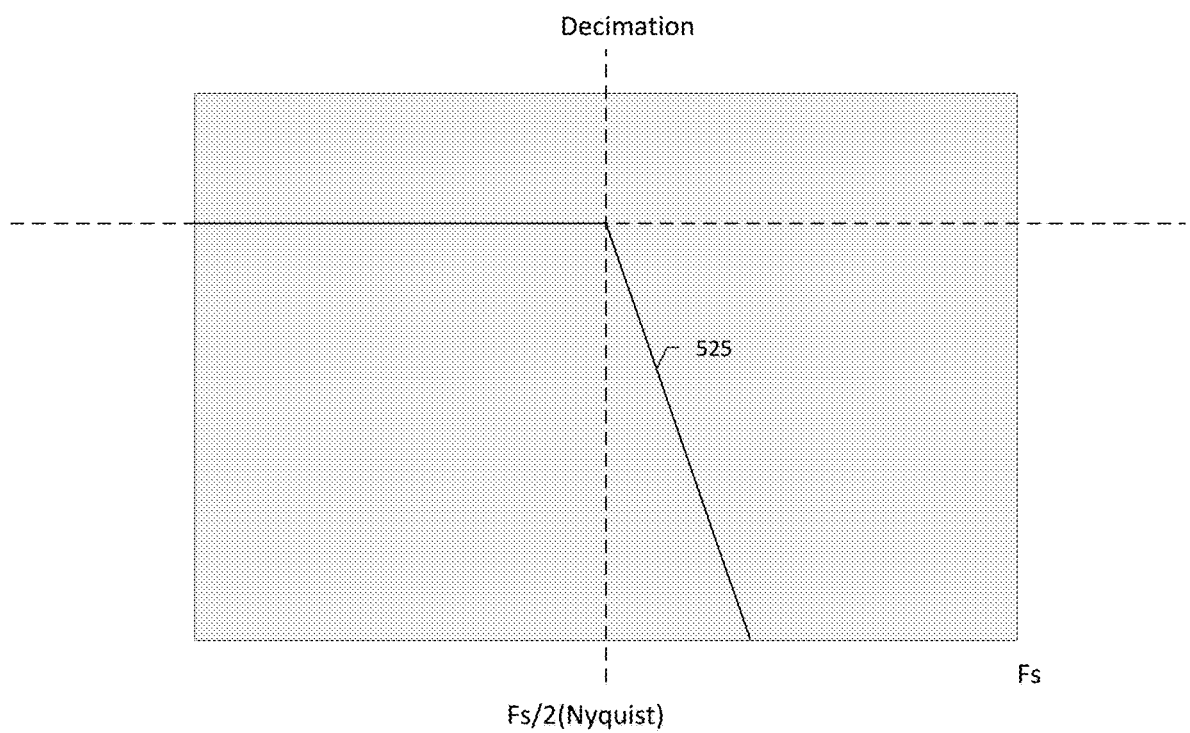

Referring to FIGS. 5-5D, various features of the concepts, systems, circuits and techniques disclosed herein and sought to be protected are illustrated. In particular, FIG. 5 shows the original signal 505 as received (e.g., at an input of the high-speed data acquisition device at block 405 of method 400) with the response characteristic typical of an anti-aliasing filter. FIG. 5A shows the response of the signal after interpolation (e.g., at an output of the interpolation means at block 415 of method 400), as indicated by signal 510. A key point is that the roll off is moved down to mid band, which makes the requirements on the FIR correction filter (e.g., applied at block 420 of method 400) more efficient. FIG. 5B shows the response characteristic of the FIR correction filter (as indicated by reference numeral 515) in comparison to the interpolated signal 510. FIG. 5C shows the filtered signal 520 generated (e.g., at block 420 of method 400) in response to the FIR correction filter (i.e., the selected FIR correction filter) being applied to the interpolated signal 510. As illustrated, application of the FIR correction filter (and associated correction factor) improves roll off of the signal. FIG. 5D shows the decimated signal 525 generated after decimation on the waveform (e.g., at an output of the decimations means at block 425 of method 400), though idealized. As illustrated, the decimation moves the frequency back to the Nyquist frequency.

As illustrated in this disclosure, the invention proposes using a technique of interpolation, FIR compensation filtering and decimation to minimize the required order of the filter and provide accurate reconstruction of the waveform. An example goal of the invention is to provide a very efficient method of properly reconstructing an analog waveform in a high-speed data acquisition device. In accordance with some embodiments of this disclosure, the proposed invention pre-conditions the incoming waveform data to correct for gain errors over frequency caused by anti-aliasing filtering and/or component variation. The invention also proposes a method where the data acquisition device can apply a calibration over frequency in a very efficient manner. It is understood that high-speed data acquisition devices in accordance with embodiments of this disclosure are not limited to sampling/capturing at particular sampling rate, or sampling rates, but rather may be configured to sample/capture data/signals at a sampling rate that is suitable for the particular application in which the high-speed data acquisition devices are used. For example, in some power monitoring system applications it may be desirable to sample data/signals at frequencies ranging from a few kilohertz to multiple megahertz. However, it is understood that higher and lower sampling frequencies are of course possible.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to improve frequency response of a high-speed data acquisition device. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for improving frequency response of a high-speed data acquisition device in a metering device, the metering device for use in a power system, the method comprising:

sampling signals received at an input of the high-speed data acquisition device at a first sampling rate using a measurement circuit of the high-speed data acquisition device, the measurement circuit including an anti-aliasing filter implemented using a network of resistors and capacitors wherein the received input signals include signals received from one or more loads in the power system;

generating, at an output of an analog-to-digital converter (ADC) coupled to the measurement circuit, a digital data stream representative of the sampled input signals wherein the generated signals are indicative of one or more monitored parameters of the sampled signals;

interpolating the digital data stream to generate an interpolated digital signal with a higher sample rate than the first sampling rate;

applying a selected response characteristic arbitrary magnitude finite impulse response (FIR) filter to the interpolated digital signal to generate a filtered digital signal, the filtered digital signal used to correct for both the parasitic errors caused by the network of resistors and capacitors and the anti-aliasing filter response within the measurement circuit;

decimating the filtered digital signal to reduce the sampling rate of the filtered digital signal and generate a decimated digital signal;

providing the decimated digital signal for configuring one or more of the monitored parameters, and wherein the decimated signal indicates a power quality issue in the power system, and the controller is responsive by adjusting the one or more of the monitored parameters in the power system to reduce the effects of the power quality issue.

2. The method of claim 1, wherein an output of the measurement circuit is distorted from the input signals due, at least in part, to the parasitic errors from the measurement circuit and the expected response of elements from the network of resistors and capacitors in the anti-aliasing filter, and the select anti-aliasing filter response characteristics.

3. The method of claim 2, wherein the anti-aliasing filter response characteristics are selected such that the anti-aliasing filter has gain roll off before the Nyquist rate.

4. The method of claim 3, wherein the change in gain is compensated for so that the frequency response of the filtered digital signal is accurate up to the Nyquist rate.

5. The method of claim 1, wherein the anti-aliasing filter is provided in an analog front end section of the measurement circuit.

6. The method of claim 5, further comprising: selecting a filter coefficient for the one or more FIR filters based on detected part variations in the analog front end section.

7. The method of claim 6, wherein the part variations are detected by a controller coupled to one or more components in the analog front end section.

8. The method of claim 7, wherein the controller is configured to detect the part variations during a calibration step, the calibration step including determining correction required based on the detected part variations.

9. The method of claim 7, wherein the filter coefficient is adjusted from a first filter coefficient to a second filter coefficient different from the first filter coefficient in response to detected changes in the part variations.

10. The method of claim 1, wherein the digital data stream is interpolated using one or more cascaded integrated comb (CIC) filters.

11. The method of claim 1, wherein the filtered digital signal is decimated using one or more cascaded integrated comb (CIC) filters.

12. The method of claim 1, wherein the high-speed data acquisition device input is coupled to a signal source.

13. The method of claim 12, wherein the signal source is a utility power source.

14. The method of claim 1, further comprising:
providing the decimated digital signal to one or more systems or devices for further processing.

15. The method of claim 1, wherein the decimated digital signal corrects for gain errors in the sampled input signals.

16. The method of claim 1, wherein the selected anti-aliasing filter response characteristics includes one or more parasitic filter response characteristics if a parasitic waveform component is produced by the anti-aliasing filter.

17. The method of claim 1, wherein the selected anti-aliasing filter response characteristics includes one or more expected response filter response characteristics if an expected response waveform component is produced by the anti-aliasing filter.

18. The method of claim 1, wherein decimating the filtered digital signal to reduce the sampling rate corrects for gain errors in the sampled input signals.

19. The method of claim 1, further comprising applying more than one finite impulse response (FIR) filter to the interpolated digital signal to generate a filtered digital signal.

20. The method of claim 1, wherein applying a selected response characteristic finite impulse response (FIR) filter to the interpolated digital signal to generate a filtered digital signal is provided by an audio signal shelving filter within the high-speed data acquisition device.

21. The method of claim 1, wherein the decimated signal is processed by one or more processors associated with the metering device to identify a power quality issue in the power system in which the metering device is used.

22. A high-speed data acquisition device, comprising:
a measurement circuit coupled to an input of the high-speed data acquisition device in a metering device, the metering device for use in a power system and configured to sample signals received at the high-speed data acquisition device input at a first sampling rate, the measurement circuit including an anti-aliasing filter implemented using a network of resistors and capacitors wherein the received input signals include signals received from one or more loads in the power system;

an analog-to-digital converter (ADC) coupled to an output of the measurement circuit and configured to generate a digital data stream representative of the sampled input signals at an output thereof wherein the generated signals are indicative of one or more monitored parameters of the sampled signals;

an interpolator responsive to the digital data stream to generate an interpolated digital signal with a higher sample rate than the first sampling rate;

a selected response characteristic arbitrary magnitude finite impulse response (FIR) filter responsive to the interpolated digital signal to generate a filtered digital signal, the filtered digital signal used to correct for both the parasitic errors caused by the network of resistors and capacitors and the anti-aliasing filter response within the measurement circuit; and a decimator responsive to the filtered digital signal to reduce the sampling rate of the filtered digital signal and generate a decimated digital signal;

providing the decimated digital signal for configuring one or more of the monitored parameters, and wherein the decimated signal indicates a power quality issue in the power system, and the controller is responsive by adjusting the one or more of the monitored parameters in the power system to reduce the effects of the power quality issue.

23. The system of claim 22, wherein the interpolator includes or is implemented using one or more cascaded integrated comb (CIC) filters.

24. The system of claim 22, wherein the decimator includes or is implemented using one or more cascaded integrated comb (CIC) filters.

25. The system of claim 22, wherein the high-speed data acquisition device input is coupled to a signal source.

26. The system of claim 25, wherein the signal source is a utility power source.

27. The device of claim 22, further comprising applying more than one finite impulse response (FIR) filter to the interpolated digital signal to generate a filtered digital signal.

* * * * *